(12) United States Patent
Dentoni Litta et al.

(10) Patent No.: US 11,348,842 B2
(45) Date of Patent: May 31, 2022

(54) SPLIT REPLACEMENT METAL GATE INTEGRATION

(71) Applicant: IMEC VZW, Leuven (BE)

(72) Inventors: Eugenio Dentoni Litta, Leuven (BE); Boon Teik Chan, Wilsele (BE); Steven Demuynck, Aarschot (BE)

(73) Assignee: Imec VZW, Leuven (BE)

( * ) Notice: Subject to any disclaimer, the term of this patent is extended or adjusted under 35 U.S.C. 154(b) by 15 days.

(21) Appl. No.: 17/074,047

(22) Filed: Oct. 19, 2020

(65) Prior Publication Data

US 2021/0118747 A1 Apr. 22, 2021

(30) Foreign Application Priority Data

Oct. 22, 2019 (EP) .................................. 19204734

(51) Int. Cl.
*H01L 21/8238* (2006.01)
*H01L 27/092* (2006.01)
(Continued)

(52) U.S. Cl.
CPC ............ *H01L 21/823842* (2013.01); *H01L 21/02603* (2013.01); *H01L 21/28088* (2013.01); *H01L 21/823807* (2013.01); *H01L 21/823814* (2013.01); *H01L 21/823864* (2013.01); *H01L 27/092* (2013.01); *H01L 29/0673* (2013.01); *H01L 29/42392* (2013.01); *H01L 29/4908* (2013.01); *H01L 29/66545* (2013.01);
(Continued)

(58) Field of Classification Search
CPC ....... H01L 21/823842; H01L 21/02603; H01L 21/28088; H01L 21/823807; H01L 21/823814; H01L 21/823864; H01L 27/092; H01L 29/0673; H01L 29/42392; H01L 29/4908; H01L 29/66545; H01L 29/66553; H01L 29/66636; H01L 29/66742; H01L 29/78618; H01L 29/78696
USPC ......................................... 438/154
See application file for complete search history.

(56) References Cited

U.S. PATENT DOCUMENTS 9,082,789 B2 7/2015 Huang et al.
9,570,318 B1 2/2017 Cho et al.
(Continued)

OTHER PUBLICATIONS

Extended European Search Report and Written Opinion, EP Application No. 19204734.8, dated Apr. 6, 2020, 10 pages.
(Continued)

*Primary Examiner* — Tong-Ho Kim
(74) *Attorney, Agent, or Firm* — McDonnell Boehnen Hulbert & Berghoff LLP

(57) ABSTRACT

A method for forming a semiconductor device, the method including: providing a substrate with at least one fin or nanowire; forming a dummy gate; providing spacers on the at least one fin or nanowire and the dummy gate; performing a first RMG module wherein high-k material is provided on at least one fin or nanowire, between the spacers; one or more annealing steps; providing a sacrificial plug between the spacers; epitaxially growing a source and drain in the at least one fin or nanowire; removing the sacrificial plug; performing a second RMG module wherein a WFM is deposited between at least part of the spacers such that the WFM is covering the high-k material of the at least one fin or nanowire.

15 Claims, 17 Drawing Sheets

(51) Int. Cl.
  *H01L 29/06*    (2006.01)
  *H01L 29/423*   (2006.01)
  *H01L 29/49*    (2006.01)
  *H01L 29/786*   (2006.01)
  *H01L 21/02*    (2006.01)
  *H01L 21/28*    (2006.01)
  *H01L 29/66*    (2006.01)

(52) U.S. Cl.
  CPC .. *H01L 29/66553* (2013.01); *H01L 29/66636* (2013.01); *H01L 29/66742* (2013.01); *H01L 29/78618* (2013.01); *H01L 29/78696* (2013.01)

(56) References Cited

U.S. PATENT DOCUMENTS

| | | | |
|---|---|---|---|
| 9,882,047 | B2 | 1/2018 | Leobandung |
| 10,002,766 | B1 | 6/2018 | Wen |
| 10,014,303 | B2 | 7/2018 | Zang et al. |
| 10,090,402 | B1 | 10/2018 | Park et al. |
| 10,134,864 | B2 | 11/2018 | Basker et al. |
| 10,164,057 | B1 | 12/2018 | Jeon et al. |
| 2015/0287650 | A1 | 10/2015 | Chang et al. |
| 2017/0141106 | A1 | 5/2017 | Chang et al. |
| 2018/0301417 | A1* | 10/2018 | Chen ............... H01L 29/66795 |
| 2019/0165172 | A1 | 5/2019 | Joshi et al. |
| 2019/0221483 | A1* | 7/2019 | Mulfinger ......... H01L 21/28088 |
| 2019/0319118 | A1* | 10/2019 | Lee ................... H01L 29/66666 |

OTHER PUBLICATIONS

Gao, Han Jie, Jie Zhao, Jia Hua Min, Yi Zhi Zeng, Kurban Awut, Woei Ji Song, and Shao Feng Yu. "Interfacial Layer Development for 20nm High-k Last Integration Scheme." ECS Transactions 60, No. 1 (2014): 727-731.

Yamaguchi, Shimpei, Zeynel Bayindir, Xiaoli He, Suresh Uppal, Purushothaman Srinivasan, Chloe Yong, Dongil Choi et al. "Effective work-function control technique applicable to p-type FinFET high-k/metal gate devices." Microelectronics Reliability 72 (2017): 80-84.

Frank, Martin M., Cyril Cabral, Jessica M. Dechene, Claude Ortolland, Yu Zhu, Eric D. Marshall, Conal E. Murray, and Michael P. Chudzik. "Titanium Silicide/Titanium Nitride Full Metal Gates for Dual-Channel Gate-First CMOS." IEEE Electron Device Letters 37, No. 2 (2015): 150-153.

* cited by examiner

SPLIT REPLACEMENT METAL GATE INTEGRATION

CROSS-REFERENCE TO RELATED APPLICATIONS

The present application is a non-provisional patent application claiming priority to European Patent Application No. 19204734.8, filed on Oct. 22, 2019, the contents of which are hereby incorporated by reference.

FIELD OF THE DISCLOSURE

The disclosure relates to the field of methods for forming a semiconductor device. More specifically, it relates to the integration of a replacement metal gate module in the process for forming the semiconductor device.

BACKGROUND

Different techniques have been adopted for producing MOSFET transistors. In gate first integration, first the high-k material and the metal gate are deposited. Replacement metal gate (RMG) first integration is being investigated as a way to achieve ultra-steep junctions and enhance the device performance (e.g., for FinFET/Nanosheet/Forksheet). A potential advantage of doing RMG first is that high temperature steps, such as the reliability anneal at 850-900° C., are avoided after the epitaxial growth.

In this flow, however, the gate stack undergoes the source/drain doping activation anneal. This source/drain activation anneal is done at temperatures above 550° C. and is detrimental for the metal work function.

Therefore, in some methods the RMG module is implemented as last. However, in that case, an anneal step is performed after the gate stack deposition. This is the so-called reliability anneal, which, in some examples, is not done after the epitaxial growth.

In view of this dilemma in terms of thermal budget levels, there is a need for improved RMG integration schemes.

SUMMARY

Examples herein include providing a method for forming a semiconductor device wherein the method comprises a replacement metal gate module.

Embodiments of the present disclosure relate to a method for forming a semiconductor device. The method comprises:
Providing a substrate with one or more fins on the substrate and forming a dummy gate on the one or more fins or on one or more nanowires formed from the one or more fins;
Providing spacers on the one or more fins or nanowires, and the dummy gate;
Performing a first replacement metal gate module wherein high-k material is provided on at least one of the one or more fins or on one or more nanowires formed from the one or more fins, between the spacers, followed by one or more annealing steps;
Providing a sacrificial plug between the spacers after performing the first replacement metal gate module;
Epitaxially growing a source and a drain in the one or more fins or in the one or more nanowires;
Removing the sacrificial plug;
Performing a second replacement metal gate module wherein a work function metal is deposited between at least part of the spacers such that the work function metal is covering the high-k material of at least some of the one or more fins or one or more of the nanowires.

In embodiments of the present disclosure, the RMG integration is split in two modules. A first module comprises the high temperature steps of the RMG. In embodiments of the present disclosure, this module is executed before the epitaxial growth. The second module of the RMG integration is executed after the epitaxial growth. The second module comprises steps which do not require a high temperature budget (e.g., the temperatures remain below 550° C.) such as deposition of a work function metal between the spacers. Splitting of the RMG module into a first and in a second module is achieved by providing the sacrificial plug before continuing with the epitaxial growth of the source and the drain. This sacrificial plug is removed before performing the second replacement gate module. It is a potential advantage of embodiments of the present disclosure that high temperature steps (e.g. above 800° C.) are avoided after epitaxial growth. This is achieved by performing the first replacement gate module before the epitaxial growth. It is, moreover, a potential advantage of embodiments of the present disclosure that the (n-type) work function metal of the gate stack is not exposed to temperatures above 550° C. Thereby, degradation of the gate stack due to excessive temperature exposure of the (n-type) work function metal which has low thermal stability is prevented. It is therefore a potential advantage of embodiments of the present disclosure that an epi-last flow can be implemented without the risk of degrading the gate stack. This is achieved by splitting the replacement metal gate module in a first and in a second replacement metal gate module wherein materials which could be damaged by a high thermal budget (e.g. above 500° C.) are only applied in steps of the second RMG module. For splitting the RMG module, additional steps are required, namely providing the sacrificial plug before the epitaxial growth and removing the sacrificial plug after the epitaxial growth and before providing the work function metal.

Methods according to embodiments of the present disclosure may be applied for obtaining FinFETs, horizontal nanowires, vertical FETs (wherein the nanowires are oriented vertically), or complementary FETs (wherein nFET and pFET wires are stacked on top of each other).

In embodiments of the present disclosure the first replacement metal gate module comprises a work function tuning integration scheme.

In embodiments of the present disclosure the first replacement metal gate module comprises providing an etch stop layer or a p-type work function metal on the high-k material.

In embodiments of the present disclosure the first replacement metal gate module comprises providing TiN on the high-k material.

The TiN may be provided before or after annealing.

In embodiments of the present disclosure the first replacement metal gate module, moreover, comprises pullback of the high-k material before providing the sacrificial plug.

It is a potential advantage of embodiments of the present disclosure that no metal is exposed during the epitaxial growth. This is achieved by pullback of the high-k material before providing the sacrificial plug which protects the high-k against exposure.

In embodiments of the present disclosure where an etch stop layer or a p-type work function metal (e.g. TiN) is provided on the high-k material (e.g. $HfO_2$), also these are pulled back in this step.

In embodiments of the present disclosure the method, moreover, comprises providing metal contacts with the source and the drain before removing the sacrificial plug.

It is thereby potentially advantageous that if SiN is used as sacrificial plug material, additional hardmask selectivity is obtained for the self-aligned contact (SAC) ILDO etch. Alternatively it could also avoid having to etch the ILDO oxide later to contact the epitaxial layer, which causes erosion of the epitaxial layer.

In embodiments of the present disclosure the deposited work function metal is an n-type work function metal.

In embodiments of the present disclosure the n-type work function metal may comprise a plurality of metals. It is a potential advantage of embodiments of the present disclosure that temperature sensitive metals such as for example aluminium containing metals (such as TiAl or TiAlC) are deposited in the second replacement metal gate module. Other metals such as TiN and TaN per se are pWFM. They may be used in NMOS as barrier/modulation.

In embodiments of the present disclosure providing the sacrificial plug comprises depositing a bilayer plug.

In embodiments of the present disclosure the one or more nanowires are horizontal nanowires.

In embodiments of the present disclosure the one or more horizontal nanowires are stacked on top of each other.

In embodiments of the present disclosure the stacked horizontal nanowires are nFET and pFET horizontal nanowires thus obtaining a complementary FET device.

In embodiments of the present disclosure the one or more nanowires are vertical nanowires.

Particular aspects of the disclosure are set out in the accompanying independent and dependent claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described hereinafter.

BRIEF DESCRIPTION OF THE FIGURES

The above, as well as additional, features will be better understood through the following illustrative and non-limiting detailed description of example embodiments, with reference to the appended drawings.

Figure 1:
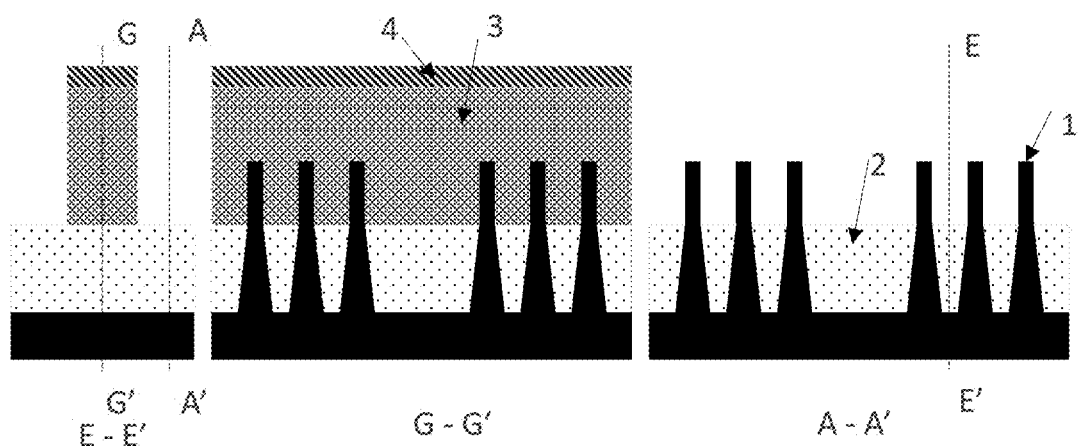
FIG. 1 shows a stack obtained when forming a FinFET device, according to an example embodiment.

Any reference signs in the claims shall not be construed as limiting the scope.

In the different drawings, the same reference signs refer to the same or analogous elements.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The drawings described are only schematic and are non-limiting. In the drawings, the size of some of the elements may be exaggerated and not drawn on scale for illustrative purposes.

Moreover, the terms top, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

Reference throughout this specification to "one embodiment" or "an embodiment" means that a particular feature, structure, or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Wherein embodiments of the present disclosure reference is made to a high-k material, reference is made to a material with a higher dielectric constant than $SiO_2$. The dielectric constant may for example be between 10 and 50. A well-known high-k material used as gate dielectric is a Hf-based material such as $HfO_2$, which has a k-value of about 25.

Embodiments of the present disclosure relate to a method for forming a semiconductor device.

The method comprises providing 110 a substrate with one or more fins 1 on the substrate and forming a dummy gate 3, 4 on the one or more fins 1 or on one or more nanowires formed from the one or more fins.

The method, moreover, comprises providing 120 spacers 5 on the one or more fins 1 or nanowires and the dummy gate 3, 4.

The method, moreover, comprises performing 130 a first replacement metal gate module wherein high-k material 7 is provided on at least one of the one or more fins 1 or on one or more nanowires formed from the one or more fins 1, between the spacers 5. One or more annealing steps are done after providing the high-k material and before the epitaxial growth of the source and drain.

The method, moreover, comprises providing 132 a sacrificial plug 9 between the spacers 5 after performing the first replacement metal gate module.

The method, moreover, comprises epitaxially growing 140 a source 11, 13 and a drain 11, 13 in the one or more fins 1 or in the one or more nanowires.

Figure 36:
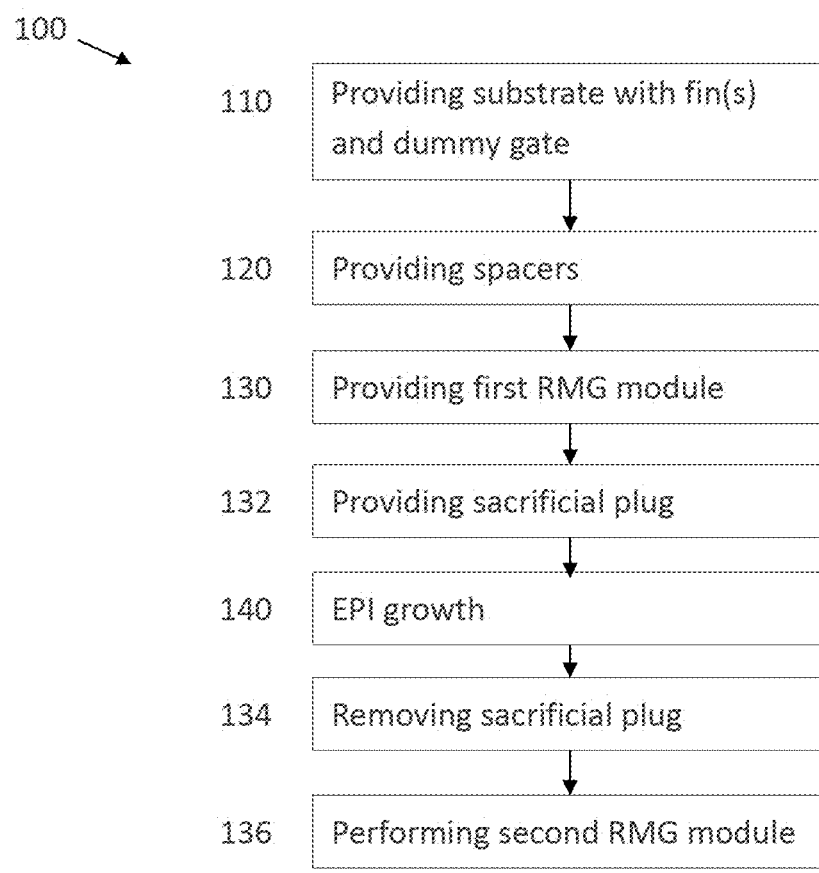
FIG. 36 shows a flow chart of a method, according to an example embodiment.

The method, moreover, comprises removing 134 the sacrificial plug 9, and performing 136 a second replacement metal gate module wherein a work function metal 14 is deposited between at least part of the spacers such that the work function metal is covering the high-k material of at least some of the one or more fins or one or more of the nanowires. A flow chart of such a method is illustrated in FIG. 36.

In embodiments of the present disclosure, split RMG integration is proposed to enable the epitaxial growth last (epi-last) scheme while avoiding exposure of the work function metal (e.g., nWFM) to high temperatures and consequent degradations. In embodiments of the present disclosure, the RMG module is divided in two parts, a first RMG module and a second RMG module, wherein the first RMG module (including all high temperature steps) is executed before the epi growth, whereas the second RMG module (including the work function metal deposition) is executed after the epi growth.

It is a potential advantage of embodiments of the present disclosure that this partition lowers the aspect ratio and complexity in high-k metal gate recess and metal gate cut, and enables more options for the (now sacrificial) gate plug for MO and epitaxial growth.

In embodiments of the present disclosure, the first RMG module may comprise providing an etch stop layer or a p-type WFM on the high-k material. The p-type WFM may for example be TiN.

In embodiments of the present disclosure the material of the sacrificial plug may be selected such that it has no negative impact on the gate stack and such that it is compatible with a selective epitaxial growth process and such that it is removable with high selectivity to $SiO_2$, to the spacer material, and to TiN.

In a particular example, this may imply that the material of the sacrificial plug can withstand the high temperature during the epitaxial growth (e.g. above 800° C.). Selective etching may for example be done by wet etching. Thereby a high selectivity may be obtained with respect to $SiO_2$ or low-k gate spacer, and SiCO during removal. The material of the sacrificial plug, in this particular example, may be selected such that it is compatible with chemical mechanical polishing and selective stopping on and selective stopping on ILDO $SiO_2$. In particular cases it may also be selected such that if has no, or only limited, interaction with TiN, pWFM during deposition or after removal, to ensure no shift in Vt.

In embodiments of the present disclosure, the material of the sacrificial plug may for example be SiN, SiC, SiCN, SiOCN.

In embodiments of the present disclosure, providing 132 the sacrificial plug comprises depositing a bilayer plug.

This may be achieved by a-Si deposition followed by chemical mechanical polishing and etchback, followed by plug fill and chemical mechanical polishing.

In embodiments of the present disclosure, a metal is provided on the high-k material before providing the sacrificial plug. It is a potential advantage of embodiments of the present disclosure that the compatibility between the metal and the sacrificial plug can be improved by depositing a bilayer plug. The a-Si of the sacrificial plug may for example be in contact with the metal resulting in no degradation in deposition, no degradation after thermal budget, no degradation after etching. By adding the a-Si, the choices for the (top) plug material can be extended to materials which are not stable in contact with metal and/or cannot be selectively etched to metal.

In embodiments of the present disclosure, not necessarily the complete space in between the spacers is filled with high-k material. Eventually the high-k material should at least form a layer between the fin or the nanowire and the work function metal. In embodiments of the present disclosure, the work function metal does not completely fill the space in between the spacers. The work function metal can cover the high-k material of at least some of the one or more fins or one or more of the nanowires.

Typically in a conventional gate last flow, a gate etch with a $SiO_2$/poly stack is followed by providing a spacer and epitaxial growth, which is followed by a replacement metal gate module, wherein the high-k material, the (multi) work-function metal, and Tungsten are provided. Thereafter a gate plug is provided (e.g. comprising SiN). The potential advantage of such a process is that the gate etch is simple, and that the gate stack experiences low temperatures only. The potential disadvantage is that the Epi sees a high temperature from the high-k anneal. It is a potential advantage that this can be avoided using a method in accordance with embodiments of the present disclosure.

In an embodiment of the present disclosure, the replacement metal gate module is split in a first module and a second module. A gate etch with a $SiO_2$/poly stack may for example be followed by a first replacement metal gate module after removing the dummy gate. In this module, a high-k material may be provided on at least one or more of the fins or on one or more nanowires formed from the one or more fins. The high-k material is provided between spacers.

Thereafter TiN may be deposited. This may be done before or after an anneal step. This step may be followed by a pullback step wherein high-k material and possibly also TiN is partly removed such that it is not exposed during epitaxial growth. Thereafter a sacrificial plug is provided, after which the epitaxial growth can be started and the metal plugs can be provided. After removing the sacrificial plug the second replacement metal gate module can be executed. A (multi) WFM may be deposited between the spacers by this module. Thereafter a tungsten fill between the spacers may be applied. Thereafter a gate plug may be provided (e.g. for contact). It is a potential advantage of embodiments of this proposed scheme that the gate etch is simple. It is, moreover, potentially advantageous that the high-k and the TiN can be exposed to high temperature and that the epi and the (multi)WFM (e.g. nWFM) are not exposed to a high temperature.

In the following paragraphs different stacks obtained using an method in accordance with embodiments of the present disclosure are discussed. These stacks are shown in FIGS. 1 to 27 for a FinFET device and in FIGS. 28 to 34 for a CFET device. The different stacks show detailed implementation steps of methods of the present disclosure. Not all method steps in these examples are strictly required. The stacks are schematically drawn. First, a substrate is provided with one or more fins 1 on the substrate and a dummy gate 3, 4 on the one or more fins 1. FIG. 1 shows different cross-sections: E-E' between the fins, G-G' orthogonal to the fins and at the dummy gate, and A-A' orthogonal to the fins and away from the dummy gate. The figure shows the fins 1, an STI oxide 2, poly-Si or amorphous Si 3 of the dummy gate, and the gate hardmask 4 ($SiO_2$/$Si_3N_4$) of the dummy gate.

Figure 2:
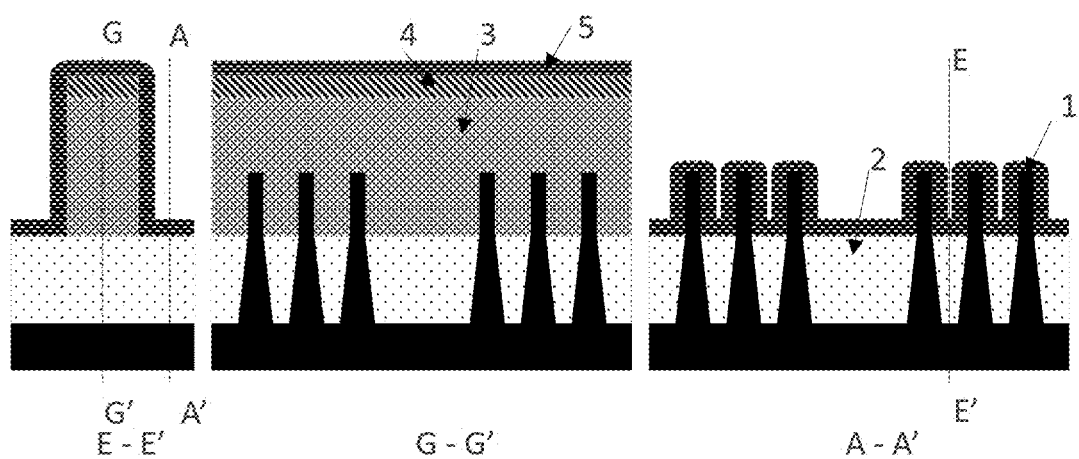
FIG. 2 shows a stack obtained when forming a FinFET device, according to an example embodiment.

FIG. 2 shows schematic drawings after providing 120 the spacers by gate spacer deposition. The gate spacer 5 material may be a low-k material (e.g. SiCO, $Si_3N_4$ or both). The dummy oxide on the fin after the fin reveal is not drawn on these figures.

Figure 3:
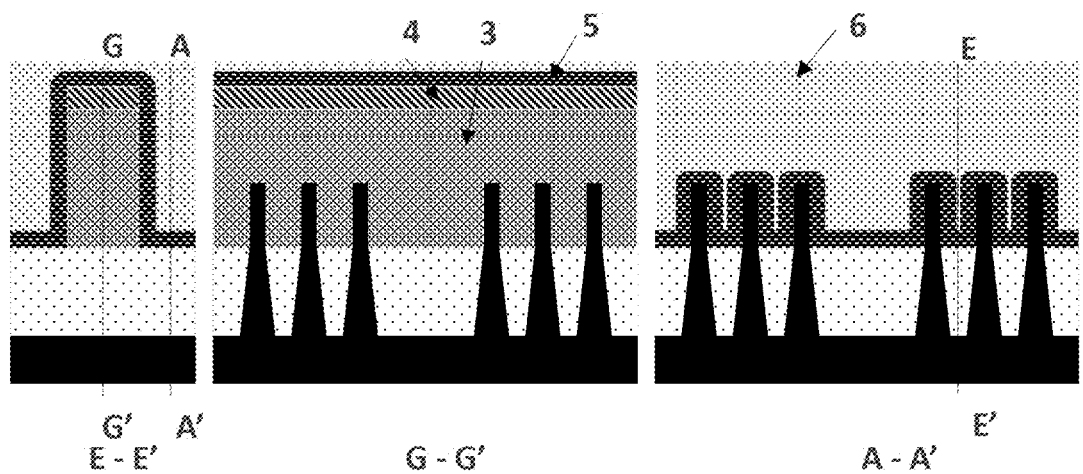
FIG. 3 shows a stack obtained when forming a FinFET device, according to an example embodiment.

FIG. 3 shows the stack comprising ILDO oxide 6, after inter layer dielectric (ILD) oxide deposition.

Figure 4:
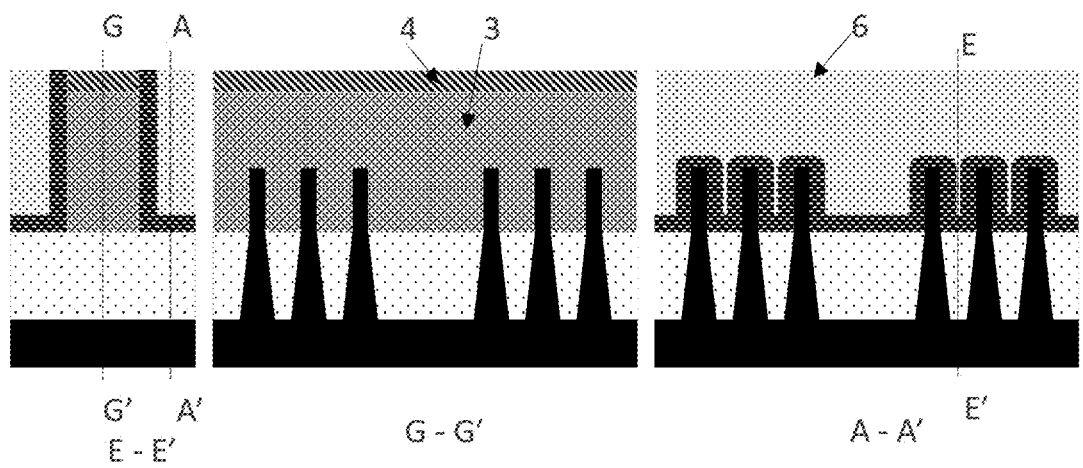
FIG. 4 shows a stack obtained when forming a FinFET device, according to an example embodiment.

After chemical mechanical polishing (CMP) the stack in FIG. 4 is obtained.

Figure 5:
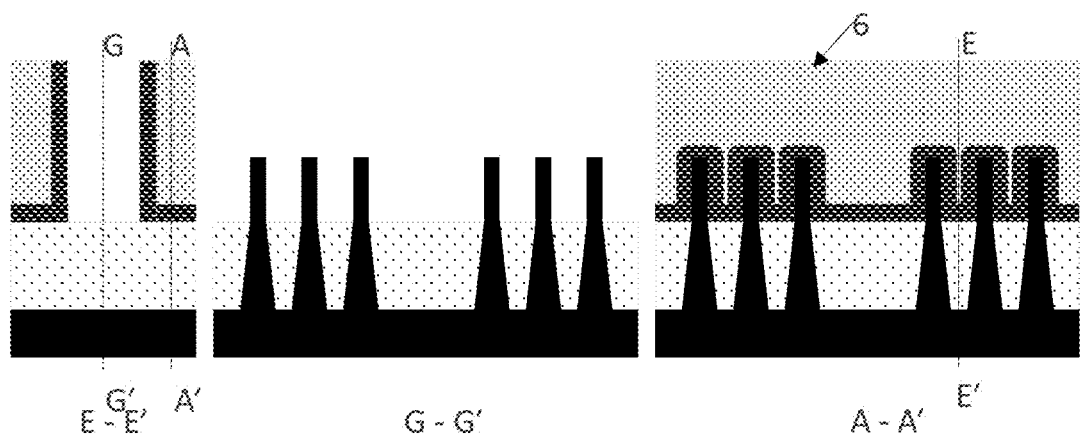
FIG. 5 shows a stack obtained when forming a FinFET device, according to an example embodiment.
Figure 6:
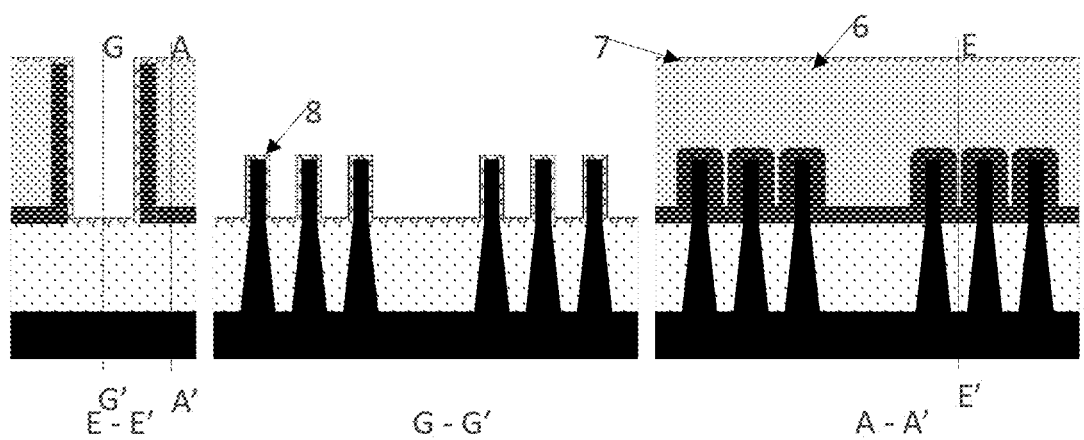
FIG. 6 shows a stack obtained when forming a FinFET device, according to an example embodiment.
Figure 7:
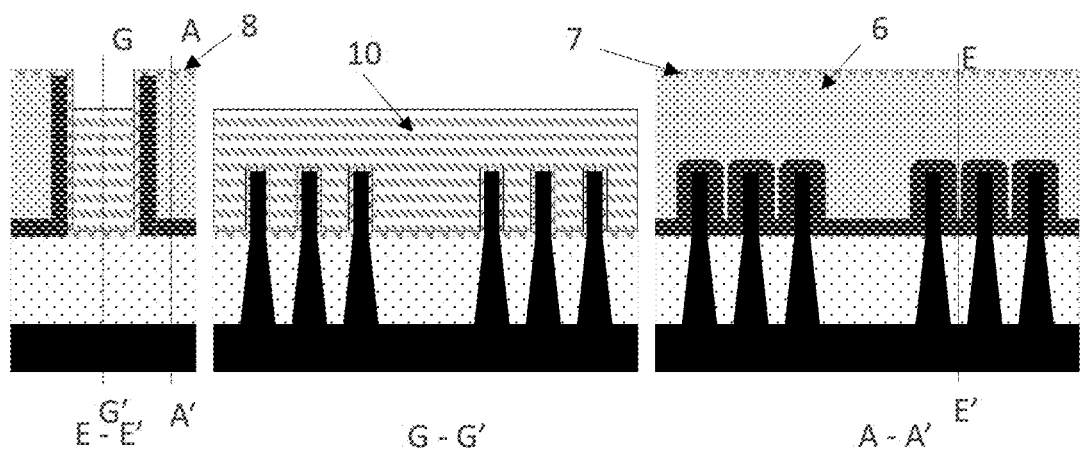
FIG. 7 shows a stack obtained when forming a FinFET device, according to an example embodiment.

After opening the gate hardmask 5 and removing the Poly-Si 3, the stack of FIG. 5 is obtained.

Next a first replacement metal gate module is executed 130. In this module high-k material 7 is provided on the stack. This may be followed by the deposition of a pWFM 8. The high-k material 7 may be provided by atomic layer deposition (ALD). For example $HfO_2$ may be deposited. The pWFM 8 may also be provided by ALD. For example TiN may be deposited. In case a dummy oxide is present, it should be removed prior to the deposition of high-k material. This dummy oxide is not drawn in the figures.

Figure 8:
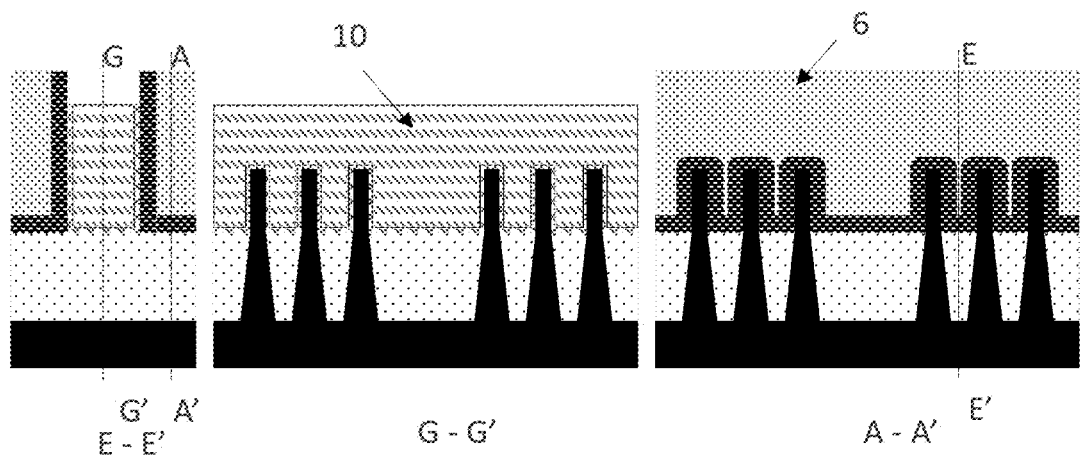
FIG. 8 shows a stack obtained when forming a FinFET device, according to an example embodiment.

In embodiments of the present disclosure performing the first replacement metal gate module may comprise SoC (spin on carbon) coat and etch back after providing the high-k material (and possibly also the pWFM). A trilayer 10, SoG (spin on glass)/SoC (spin on carbon) or BARC (bottom anti-reflective coating) may be coated and etched back. The result thereof is shown in FIG. 8. This allows to pullback the high-k material 7 (and possibly also the pWFM 8) in a next step. The result thereof is shown in FIG. 8.

Figure 9:
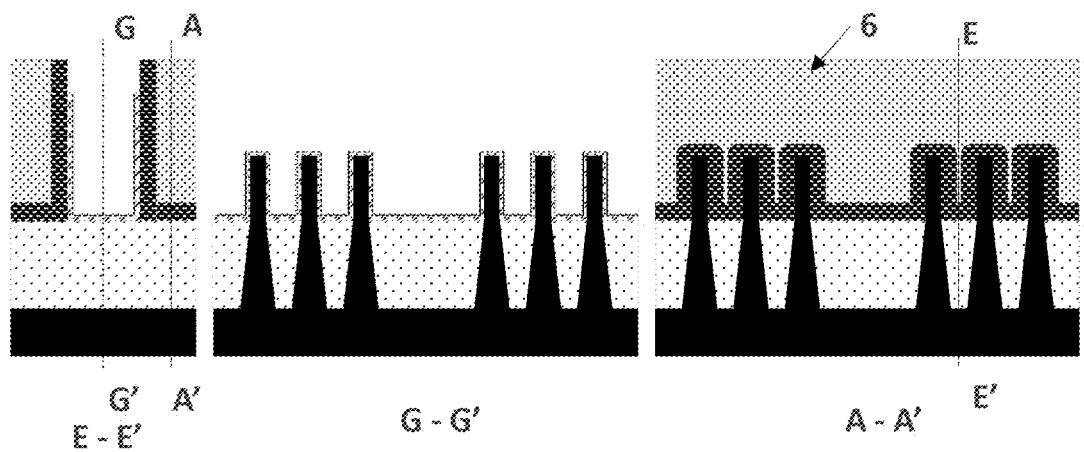
FIG. 9 shows a stack obtained when forming a FinFET device, according to an example embodiment.

After doing so, the layer 10 is removed (e.g. SoC strip). The result thereof is shown in FIG. 9.

Figure 10:
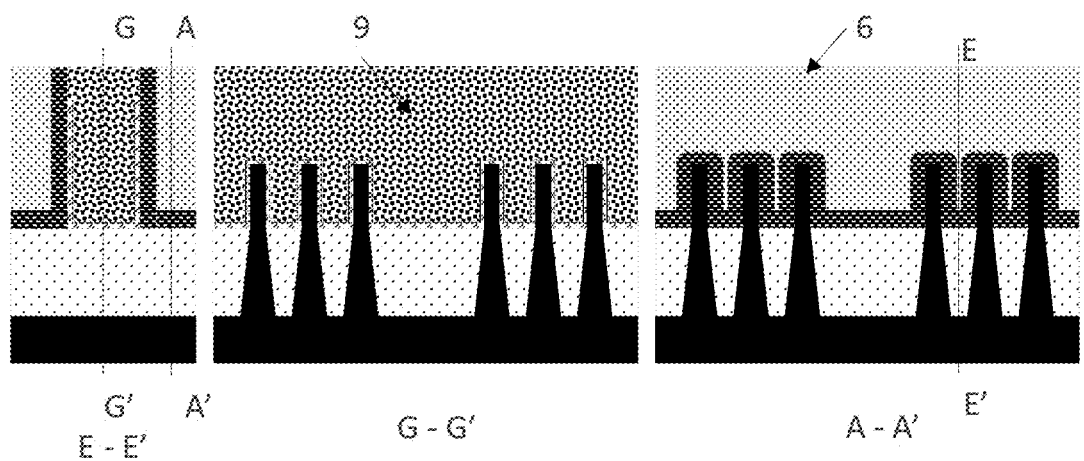
FIG. 10 shows a stack obtained when forming a FinFET device, according to an example embodiment.
Figure 11:
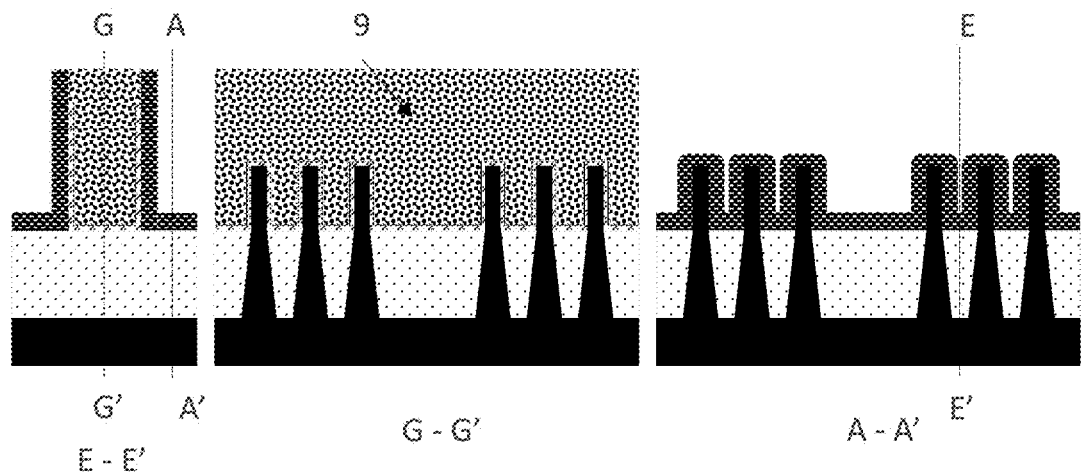
FIG. 11 shows a stack obtained when forming a FinFET device, according to an example embodiment.
Figure 12:
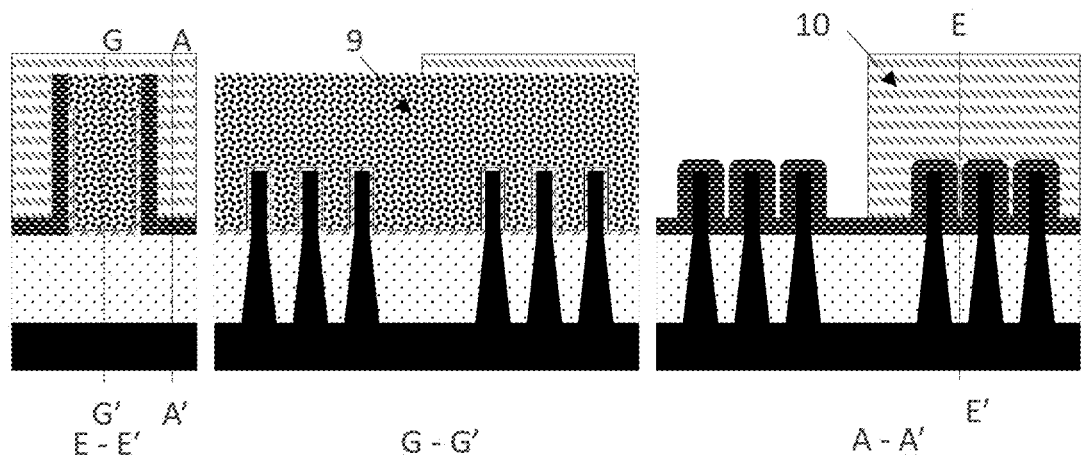
FIG. 12 shows a stack obtained when forming a FinFET device, according to an example embodiment.

In embodiments of the present disclosure a sacrificial plug 9 is provided between the spacers 5 after performing the first replacement metal gate module. The material of this sacrificial plug may for example be $Si_3N_4$. The result thereof is shown in FIG. 10.

After providing 132 the sacrificial plug 9, a source and a drain are epitaxially grown 140 in the one or more fins 1 or in the one or more nanowires. Therefore, in the example of FIG. 11, first the ILD oxide 6 is removed, which is followed by nMOS active SoG/SoC or BARC patterning resulting in layer 10 in FIG. 12.

Figure 13:
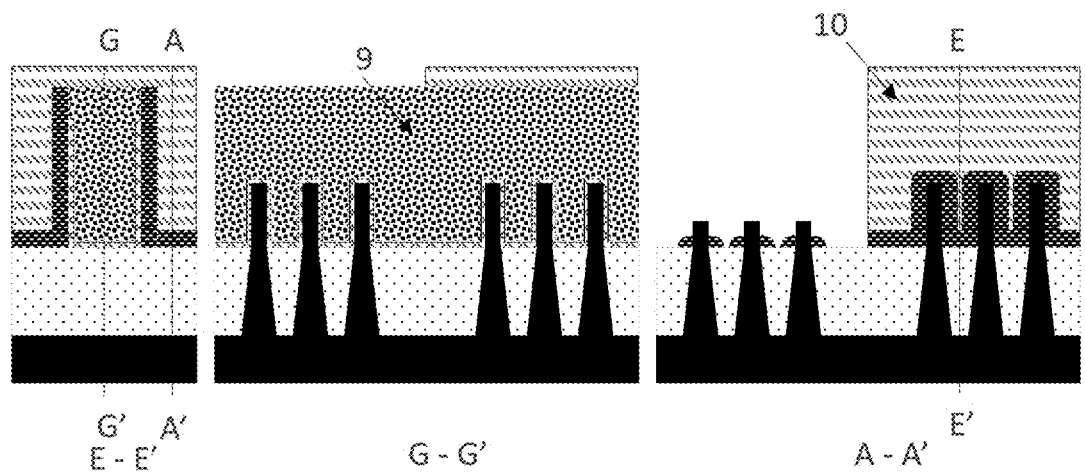
FIG. 13 shows a stack obtained when forming a FinFET device, according to an example embodiment.
Figure 14:
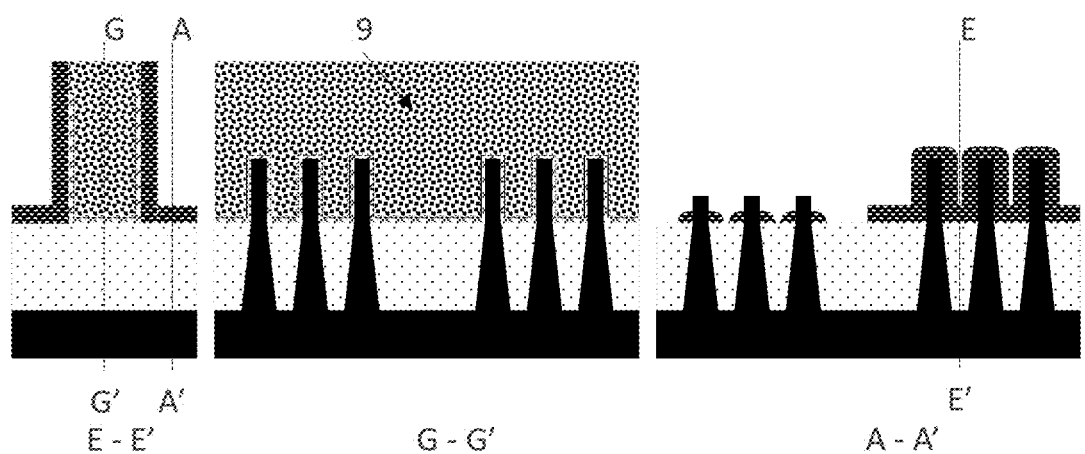
FIG. 14 shows a stack obtained when forming a FinFET device, according to an example embodiment.
Figure 15:
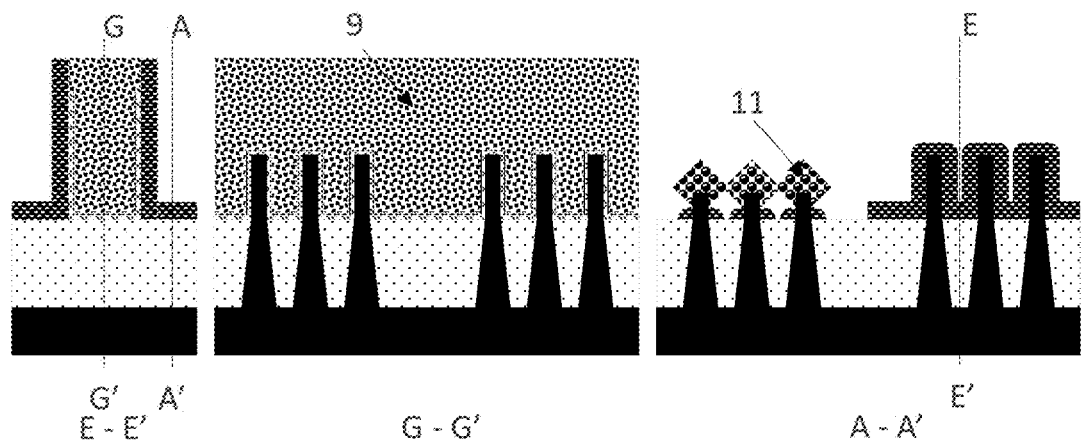
FIG. 15 shows a stack obtained when forming a FinFET device, according to an example embodiment.
Figure 16:
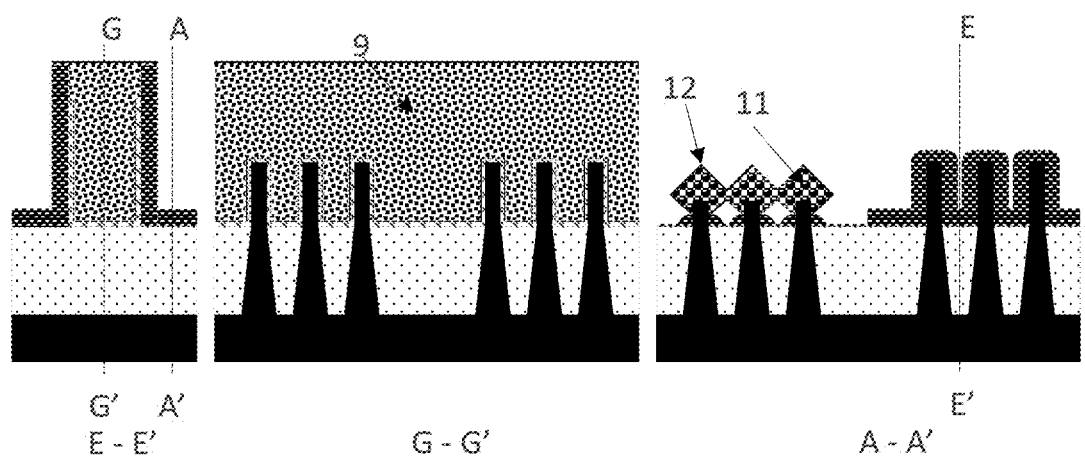
FIG. 16 shows a stack obtained when forming a FinFET device, according to an example embodiment.
Figure 17:
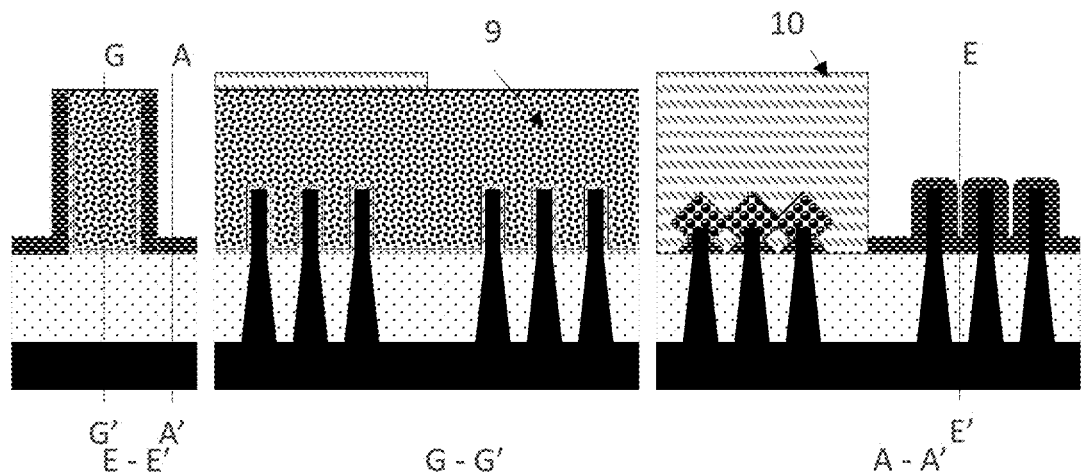
FIG. 17 shows a stack obtained when forming a FinFET device, according to an example embodiment.
Figure 18:
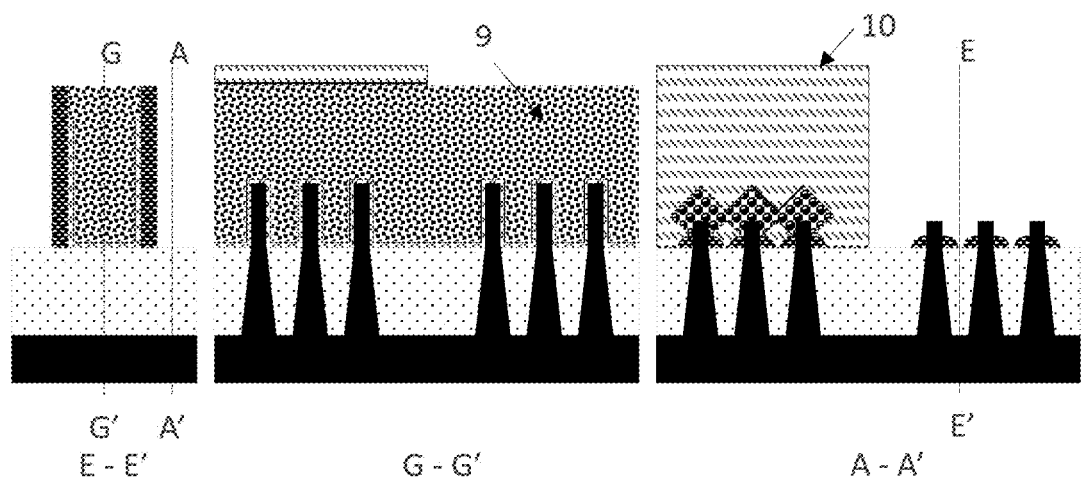
FIG. 18 shows a stack obtained when forming a FinFET device, according to an example embodiment.
Figure 19:
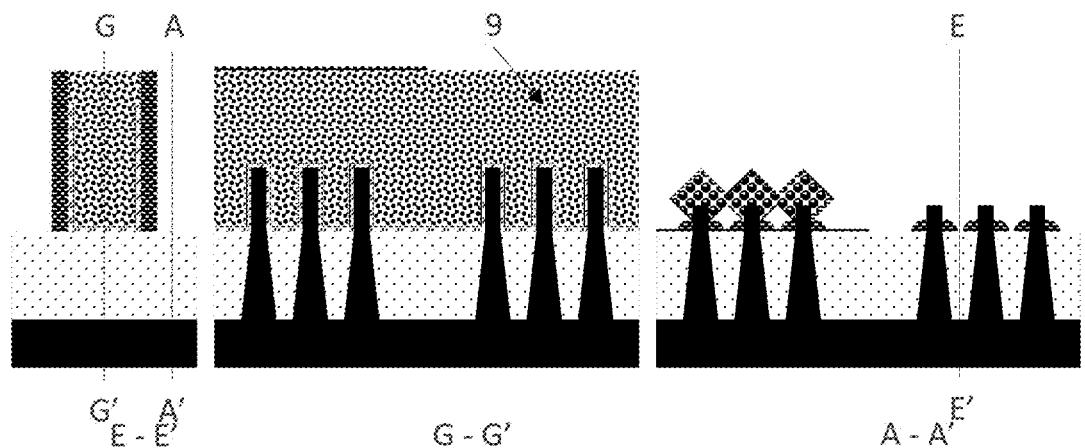
FIG. 19 shows a stack obtained when forming a FinFET device, according to an example embodiment.

The stack of FIG. 13 is obtained after an nMOS spacer etch/fin recess. This step may be followed by a SoC or BARC strip as illustrated in FIG. 14. Next the source and drain 11 of the nMOS may be epitaxially grown (Si:P). The resulting stack is schematically shown in FIG. 15. This may be followed by a $Si_3N_4$ CESL 12 (contact etch stop layer) deposition on the source and drain 11 of the nMOS.

Figure 20:
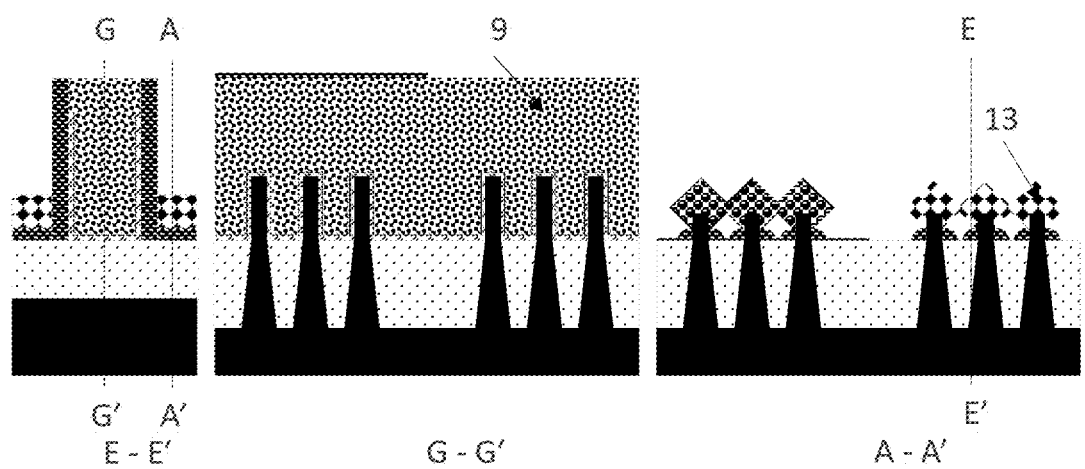
FIG. 20 shows a stack obtained when forming a FinFET device, according to an example embodiment.
Figure 21:
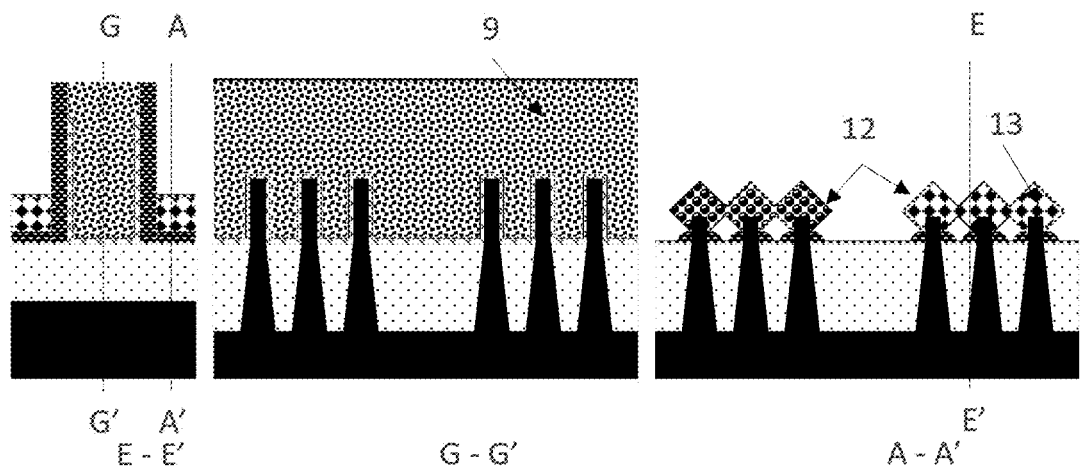
FIG. 21 shows a stack obtained when forming a FinFET device, according to an example embodiment.

Next a source and drain 13 of the pMOS may be provided. Therefore, first pMOS active SoG/SoC or BARC patterning may be applied (see layer 10 in FIG. 17). This step is followed by a pMOS spacer etch/fin recess (see FIG. 18) and by a SoC or BARC strip (see FIG. 19). Next the drain and source 13 of the pMOS are formed by SiGe epi growth. The resulting stack is shown in FIG. 20. The drain and source are also visible in the left E-E' cross section since the E-E' plane was shifted (see A-A' cross section which indicates the position of the E-E' plane). This step may be followed by a $Si_3N_4$ CESL deposition step as illustrated in FIG. 21 wherein the CESL is provided over the device.

Figure 22:
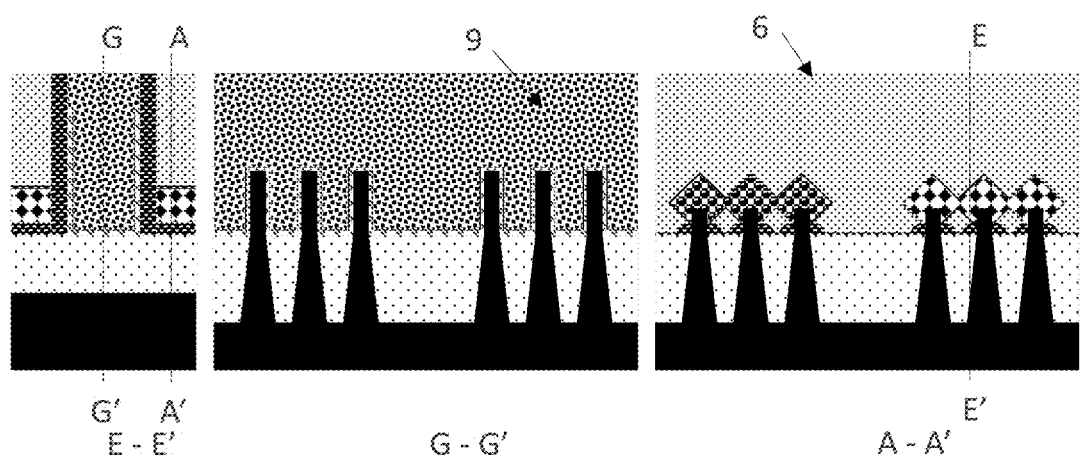
FIG. 22 shows a stack obtained when forming a FinFET device, according to an example embodiment.
Figure 23:
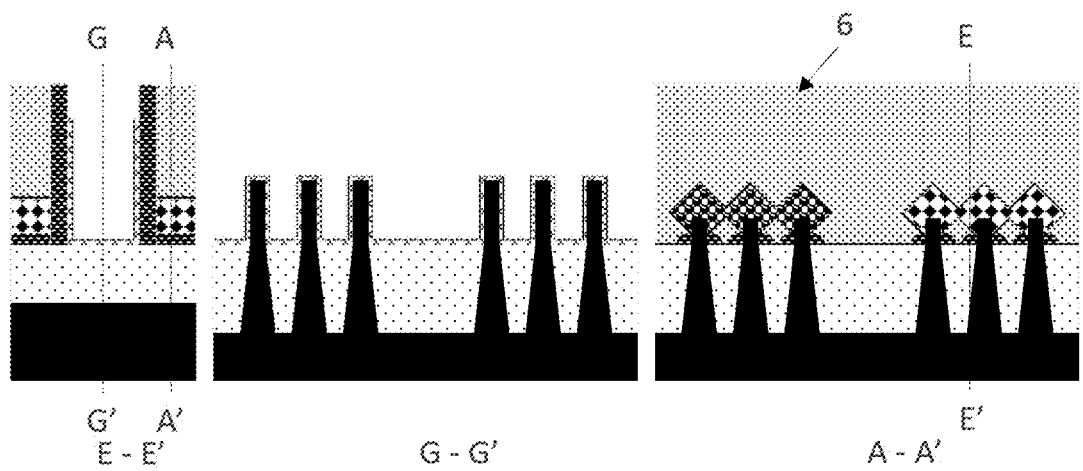
FIG. 23 shows a stack obtained when forming a FinFET device, according to an example embodiment.
Figure 24:
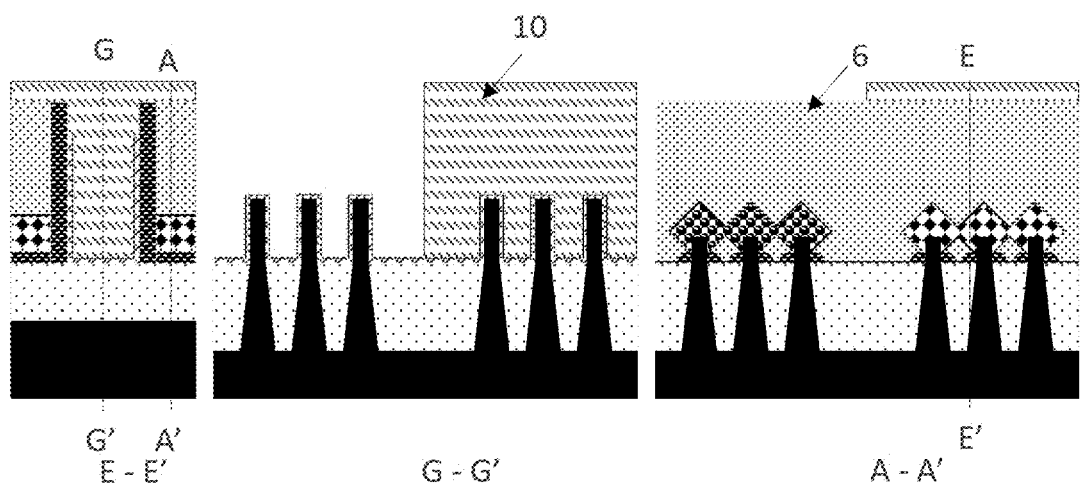
FIG. 24 shows a stack obtained when forming a FinFET device, according to an example embodiment.

This step may for example be followed by an ILD oxide deposition step and a CMP step (see FIG. 22 which shows the ILD 0 oxide material 6). Next the sacrificial plug 9 is removed 134.

Figure 25:
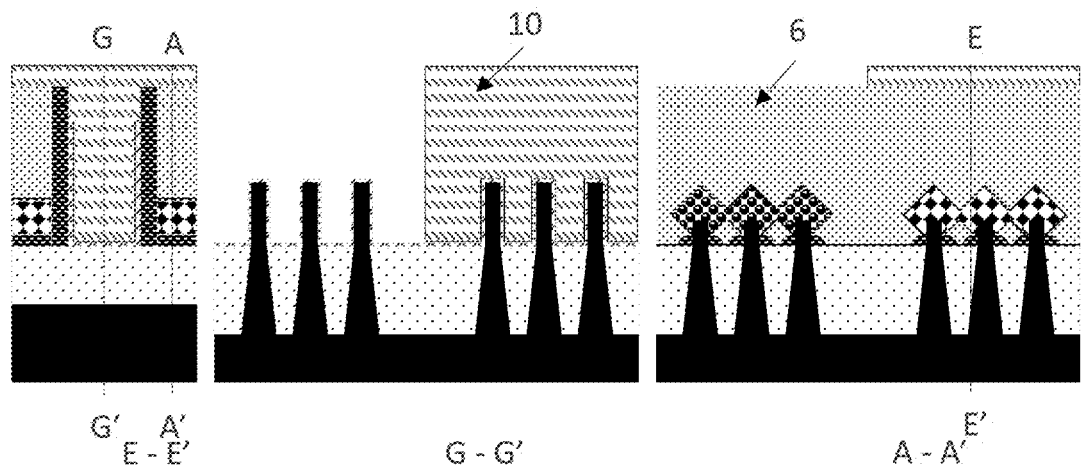
FIG. 25 shows a stack obtained when forming a FinFET device, according to an example embodiment.
Figure 26:
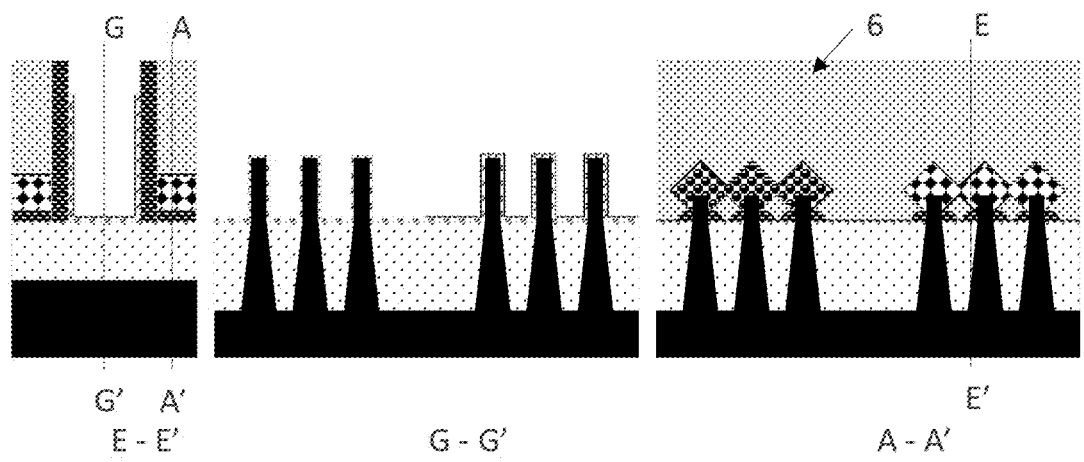
FIG. 26 shows a stack obtained when forming a FinFET device, according to an example embodiment.
Figure 27:
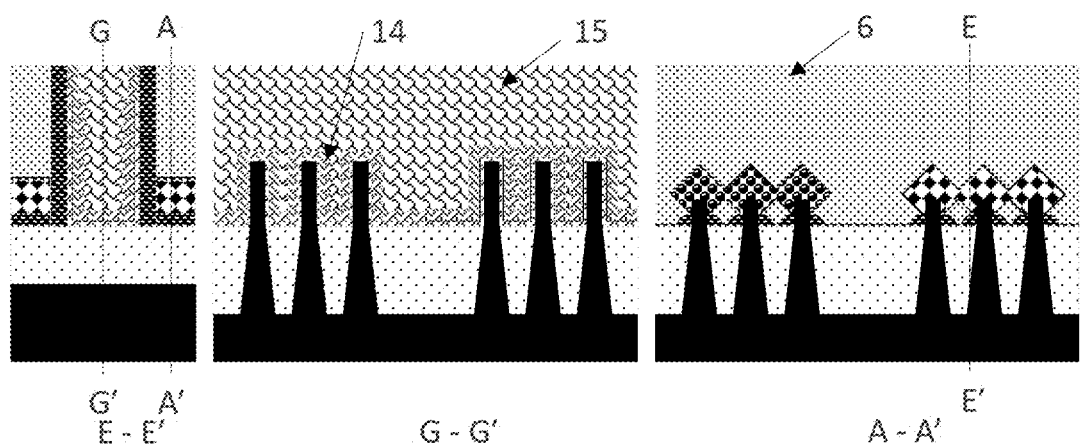
FIG. 27 shows a stack obtained when forming a FinFET device, according to an example embodiment.

Next a second replacement metal gate module is performed wherein a work function metal 14 is deposited between at least part of the spacers such that the work function metal is covering the high-k material of at least some of the one or more fins or one or more of the nanowires. In the example this is achieved by first providing nMOS RMG SoG/SoC or BARC patterning (see layer 10 in FIG. 24). Next the pWFM is removed. This may be done by hydrochloric acid hydrogen peroxide mixture (HPM) etching or by ammonium hydrogen peroxide mixture (APM) etching. The result thereof is shown in FIG. 25. After doing so, in this embodiment of the present disclosure, the SoC or BARC strip 10 is removed. The result thereof is shown in FIG. 26. Next the WFM 14 is deposited between the spacers. In this example the work function metal is an nWFM. It comprises an aluminium containing metal and may additionally comprise other metals such as TiN or TaN which are pWFM but which may be used in NMOS as barrier/modulation.

Figure 35:
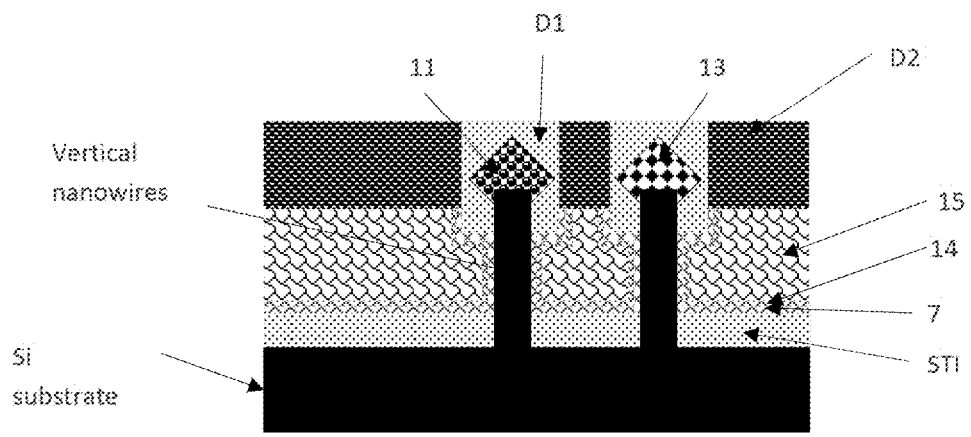
FIG. 35 shows a semiconductor device comprising vertical nanowires, according to an example embodiment.

In embodiments of the present disclosure vertical nanowires may be formed from the one or more fins. Also in these embodiments the same strategy may be applied wherein first a first replacement gate module is executed for providing the high-k material and possibly also the pWFM may be provided. Next, a sacrificial plug is provided for protecting the high-k material and possibly also the pWFM when epitaxially growing a source and drain in the one or more vertical nanowires. After the epi growth for nMOS and pMOS, the sacrificial plug can be removed and the second replacement metal gate module can be executed. In that second RMG module a work function metal is deposited. An example of a cross-section of such a semiconductor device is schematically shown in FIG. 35. This figure shows a Silicon substrate with on top thereof the vertical nanowires, the nMOS epitaxial growth 11, the pMOS epitaxial growth 13, the first dielectric D1 (e.g. the ILD oxide 6) the second dielectric D2, the STI layer, the high-k material 7 (which in this example is $HFO_2$), the work function metal 14, and the tungsten contact 15 at the gate. The second dielectric is present on top of the tungsten contact. In this example flexibility is kept by having two different dielectric materials to separate the epi regions and the metal contact regions.

In embodiments of the present disclosure, one or more horizontal nanowires may be formed from the fins. These nanowires may be stacked on top of each other. The stacked horizontal nanowires may be nFET and pFET horizontal nanowires thus obtaining a complementary FET device.

Figure 28:
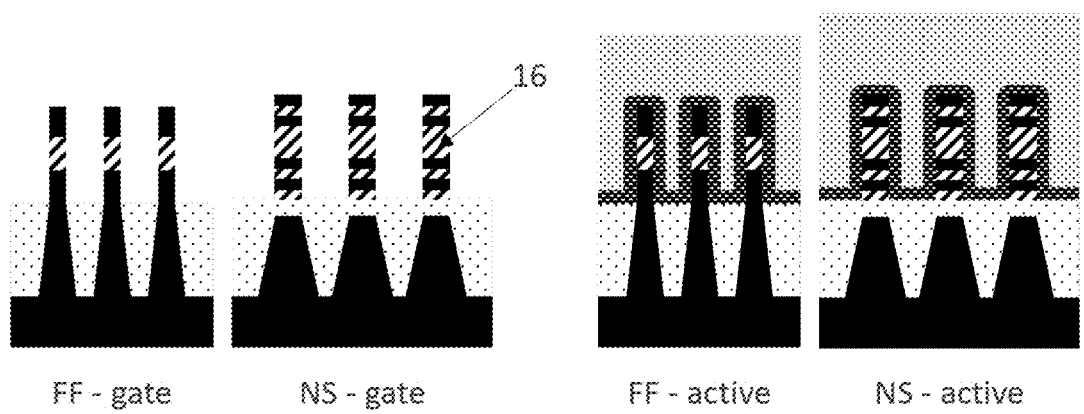
FIG. 28 shows a stack obtained when forming a CFET device, according to an example embodiment.

FIG. 28 shows the gate after poly-Si removal (as in FIG. 5), for a CFET FinFET version with vertical nanosheets, and for a CFET nanosheet version with horizontal nanosheets. The figure also shows the SiGe epitaxy layer 16. The right figures show the active part of the FinFET version and of the nanosheet version.

Figure 29:
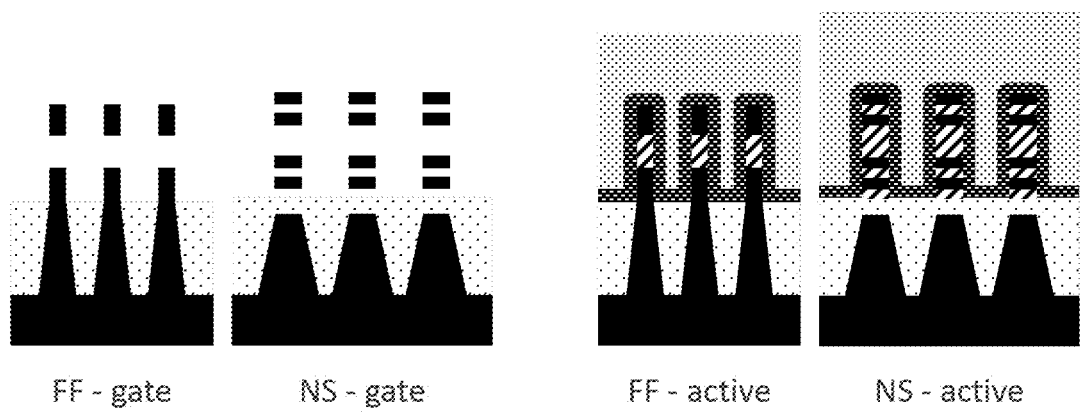
FIG. 29 shows a stack obtained when forming a CFET device, according to an example embodiment.

FIG. 29 shows the result after the nanowire release.

Figure 30:
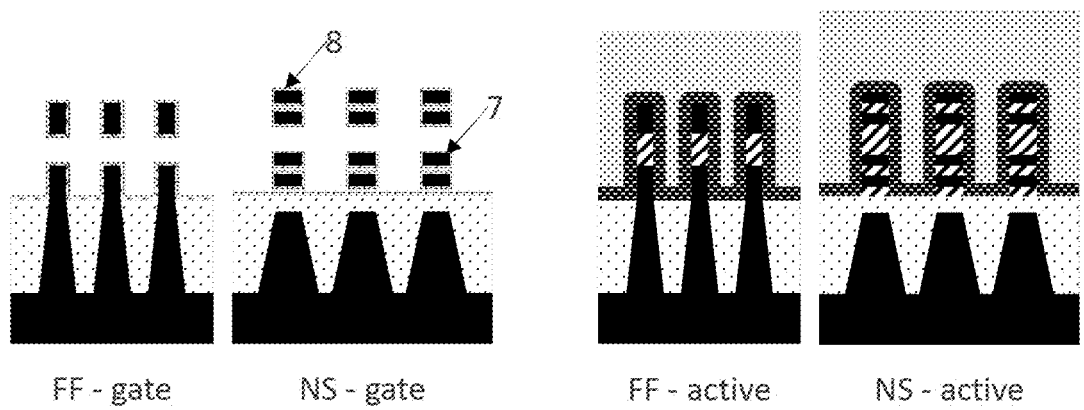
FIG. 30 shows a stack obtained when forming a CFET device, according to an example embodiment.

FIG. 30 shows the result after deposition of the high-k material 7 and possibly also the pWFM deposition 8.

Figure 31:
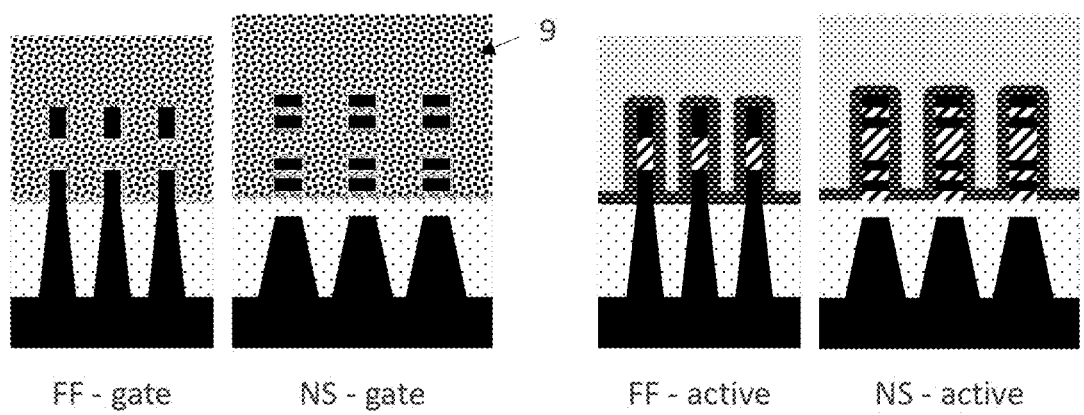
FIG. 31 shows a stack obtained when forming a CFET device, according to an example embodiment.

FIG. 31 shows the results after depositing the sacrificial plug 9 and CMP.

Figure 32:
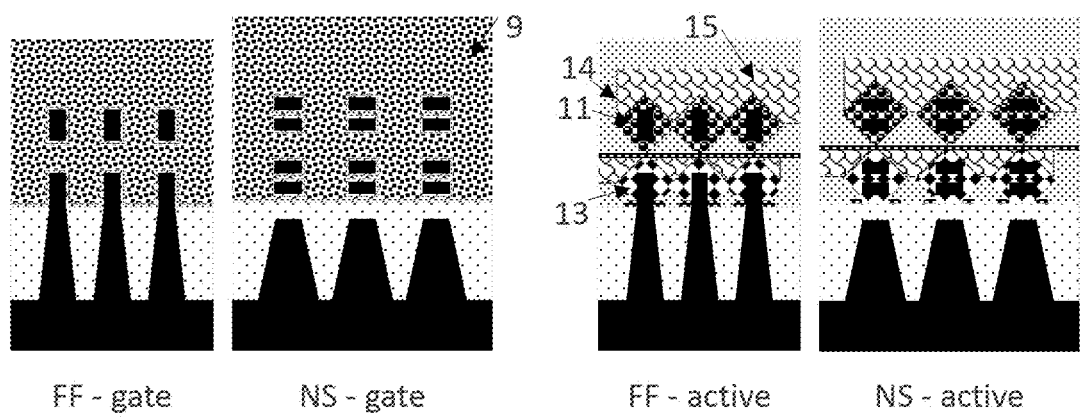
FIG. 32 shows a stack obtained when forming a CFET device, according to an example embodiment.

FIG. 32 shows the result after epitaxially growing the source and drains and after providing the contacts. This may be achieved by epitaxial growth (for pMOS) followed by providing a contact, followed by epitaxial growth (for nMOS) followed by providing a contact. In the example of FIG. 32 the sacrificial filling material 9, the nMOS epitaxial growth 11, the pMOS epitaxial growth 13, the nWFM 14, and the tungsten contact 15 are shown.

Figure 33:
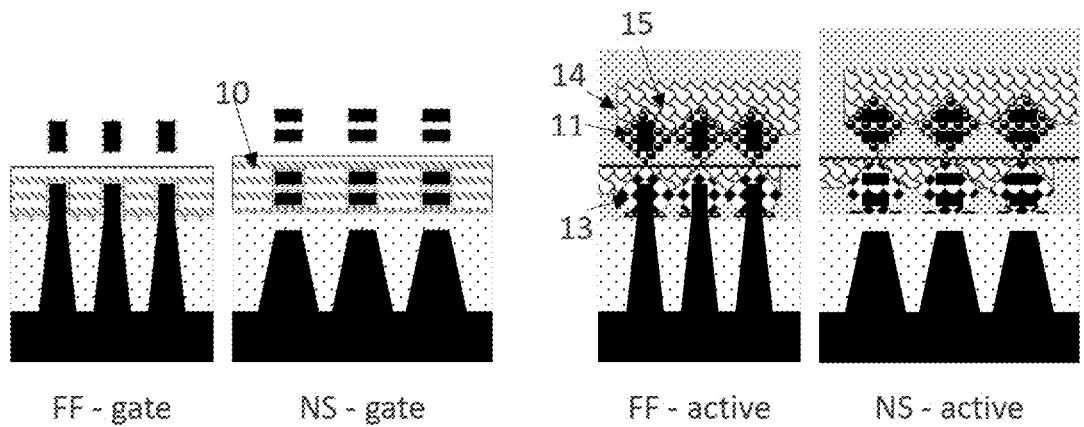
FIG. 33 shows a stack obtained when forming a CFET device, according to an example embodiment.
Figure 34:
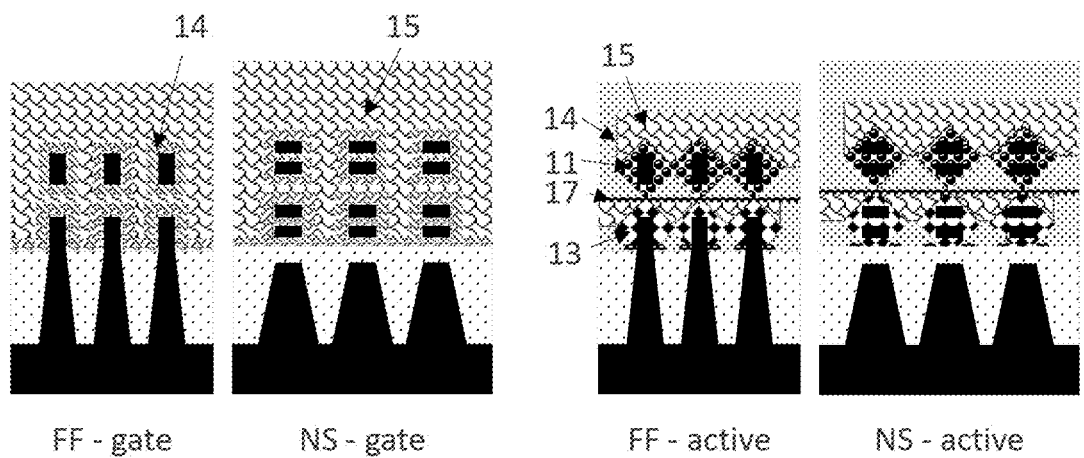
FIG. 34 shows a stack obtained when forming a CFET device, according to an example embodiment.

Next the second replacement gate module is applied. FIG. 33 shows the result after removing the pWFM and after providing the tri-layer 10 comprising SoG/SoC or BARC. FIG. 34 shows the result after providing the nWFM 14 and the tungsten contact 15 at the gate. As in FIG. 33 this figure also shows the sacrificial filling material 9, the nMOS epitaxial growth 11, the pMOS epitaxial growth 13, the nWFM 14, and the tungsten contact 15. In this figure also the vertical isolation 17 is indicated. This vertical isolation may comprise $Si_3N_4$, or SiCO, or $SiO_2$.

In embodiments of the present disclosure, epitaxial growth for pMOS may be done before epitaxial growth for nMOS or vice versa.

In embodiments of the present disclosure the first replacement metal gate module 130 may comprise a work function tuning integration scheme. The work function tuning integration scheme provides a way of integrating one or more gate metals and/or gate stacks with the purpose of tuning the effective work function for one or more types of devices according to the threshold voltage targets. The work function tuning may for example be based on high-temperature diffusion steps.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for forming a semiconductor device, the method comprising:
   providing a substrate with one or more fins on the substrate and forming a dummy gate on the one or more fins or on one or more nanowires formed from the one or more fins;
   depositing spacers on the one or more fins or the one or more nanowires and the dummy gate;
   after depositing the spacers, performing a first replacement metal gate module wherein high-k material is provided on at least one of the one or more fins or on the one or more nanowires between the spacers, followed by one or more annealing steps;
   providing a sacrificial plug between the spacers after performing the first replacement metal gate module;
   epitaxially growing a source and a drain in the one or more fins or in the one or more nanowires;
   removing the sacrificial plug; and
   performing a second replacement metal gate module wherein a work function metal is deposited between at least part of the spacers such that the work function metal is covering the high-k material of at least some of the one or more fins or one or more of the one or more nanowires.

2. The method according to claim 1, wherein the first replacement metal gate module further comprises a work function tuning integration scheme.

3. The method according to claim 1, wherein the first replacement metal gate module further comprises providing an etch stop layer or a p-type work function metal on the high-k material.

4. The method according to claim 1, wherein the first replacement metal gate module further comprises providing TiN on the high-k material.

5. The method according to claim 4, wherein providing the TiN on the high-k material comprises providing the TiN on the high-k material prior to the one or more annealing steps.

6. The method according to claim 4, wherein providing the TiN on the high-k material comprises providing the TiN on the high-k material after the one or more annealing steps.

7. The method according to claim 1, wherein the first replacement metal gate module further comprises pullback of the high-k material before providing the sacrificial plug.

8. The method according to claim 1, further comprising providing metal contacts with the source and the drain before removing the sacrificial plug.

9. The method according to claim 1, wherein the work function metal is an n-type work function metal.

10. The method according to claim 9, wherein the work function metal comprises a plurality of metals.

11. The method according to claim 1, wherein providing the sacrificial plug comprises depositing a bilayer plug.

12. The method according to claim 1, wherein the one or more nanowires are horizontal nanowires.

13. The method according to claim 12, wherein the horizontal nanowires are stacked on top of each other.

14. The method according to claim 13, wherein the horizontal nanowires are nFET and pFET horizontal nanowires thus forming a complementary FET device.

15. The method according to claim 1, wherein the one or more nanowires are vertical nanowires.

* * * * *